United States Patent [19]
Mangtani et al.

[11] Patent Number: 5,767,731
[45] Date of Patent: Jun. 16, 1998

[54] CIRCUIT FOR ERROR FREE OPERATION OF OPTO-ISOLATED DRIVER DURING POWER-UP

[75] Inventors: Vijay Mangtani, Playa Del Rey; Ajit Dubhashi, El Segundo, both of Calif.

[73] Assignee: International Rectifier Corporation, El Segundo, Calif.

[21] Appl. No.: 761,838

[22] Filed: Dec. 9, 1996

Related U.S. Application Data

[60] Provisional application No. 60/013,583, Dec. 27, 1995.
[51] Int. Cl.$^6$ .................................................. H01L 31/00
[52] U.S. Cl. .......................... 327/514; 327/317; 257/82; 257/84; 250/206
[58] Field of Search ............................ 257/82, 84, 257; 250/206; 313/523, 524; 327/317, 514

[56] References Cited

U.S. PATENT DOCUMENTS

| | | | |
|---|---|---|---|
| 4,263,521 | 4/1981 | Senger | 307/353 |
| 4,417,099 | 11/1983 | Pierce | 179/2 DP |
| 4,766,471 | 8/1988 | Ovshinsky et al. | 357/19 |
| 5,283,441 | 2/1994 | Fabian | 250/551 |

*Primary Examiner*—Timothy P. Callahan
*Assistant Examiner*—Jung Ho Kim
*Attorney, Agent, or Firm*—Ostrolenk, Faber, Gerb & Soffen, LLP

[57] ABSTRACT

A protection circuit for preventing momentary activation of the output of an output-isolated driver during power turn on. The protection circuit operates in a manner which prevents a buffer which is driven by the opto-isolator from turning on power transistors during power turn on, particularly in applications such as switching power supplies, motor controllers and the like.

9 Claims, 2 Drawing Sheets

CIRCUIT FOR ERROR FREE OPERATION OF OPTO-ISOLATED DRIVER DURING POWER-UP

CROSS REFERENCE TO RELATED APPLICATION

Under the provisions of 35 U.S.C. §120, this application claims priority to related U.S. Provisional application No. 60/013,583 filed Dec. 27, 1995.

BACKGROUND OF THE INVENTION

This invention relates to a driver for an IGBT or other power semiconductor device and, more particularly, to a driver which prevents a glitch in the output of the driver from reaching the driven IGBT or a power semiconductor device when the power supply or voltage to the driver is ramping up, i.e. when the circuit is being powered up.

In certain electronic circuits, it is necessary to drive the gate of an IGBT or other power semiconductor device with an isolated driver. Typically, an opto-isolator, such as the HCPL4506, is employed for this purpose. As shown in the schematic circuit diagram of FIG. 1, the opto-isolator 2 drives a buffer 4, which in turn drives the gate 7 of the IGBT 6. A filtering capacitor $C_2$ is connected between the DC supply $V_{cc}$ and the common line 5, as shown.

The problem with the prior art circuit depicted in FIG. 1 is that the output of the opto-isolator 2 has a glitch 8 (FIG. 2) on its output 10 when $V_{cc}$ (the supply voltage) is ramping up. This glitch 8 is caused by the large collector to base capacitance of an internal transistor in the opto-isolator 2, which turns on the internal transistor momentarily, causing the glitch 8 in the output 10 of the opto-isolator during power-up.

The above-described glitch 8 in the output 10 of the opto-isolator 2 during power-up is fed to the inverter buffer 4 in the circuit of FIG. 1 which, as shown in FIG. 2, produces an output 9 with a deleterious pulse 12 that causes the IGBT 6 to be turned on momentarily.

In applications that use $V_{cc}$ generated by bootstrapped, charge-pumped as well as isolated power supplies, the glitch could disadvantageously cause both IGBTs 6 in the same leg to turn ON at the same time, as shown in FIG. 3.

Accordingly, it would be desirable to provide circuitry which prevents the above-described glitch in the output of an opto-isolator 2 from reaching the buffer 4 during power-up, but which also permits gate drive signals from the opto-isolator to reach the buffer 4 (and hence control the gate of the IGBT) during normal circuit operation following power-up, without adding any delay.

SUMMARY OF THE INVENTION

The present invention achieves the foregoing objective by providing circuitry, disposed between the opto-isolator and the gate of the IGBT, which clamps the output of the opto-isolator to a higher voltage than the voltage required to drive the buffer. Advantageously, the circuitry of the invention does not affect system timing delays during normal operation.

Other features and advantages of the present invention will become apparent from the following description of the invention which refers to the accompanying drawings.

DETAILED DESCRIPTION OF THE PREFERRED EMBODIMENT

Figure 1:
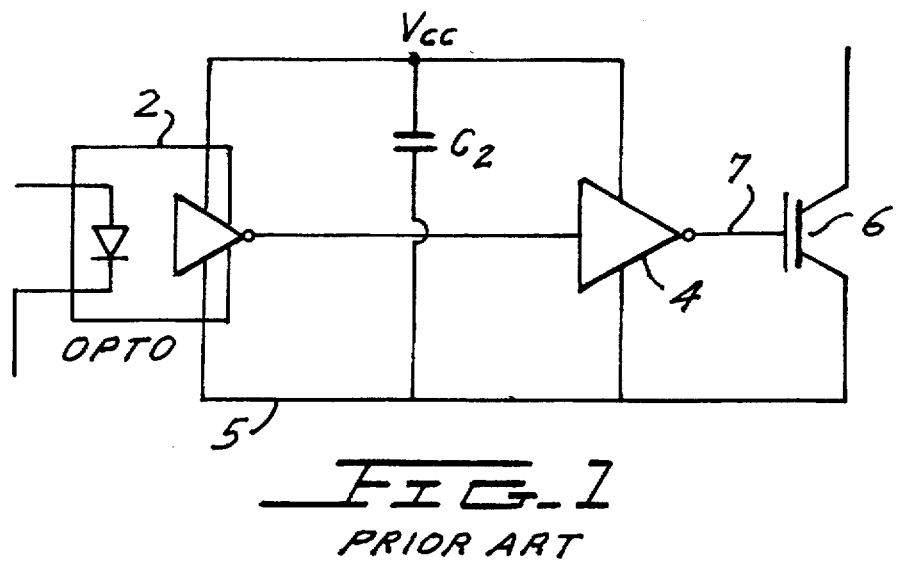
FIG. 1 is a schematic diagram of a prior art circuit in which an opto-isolated driver is used to drive an IGBT.
Figure 2:
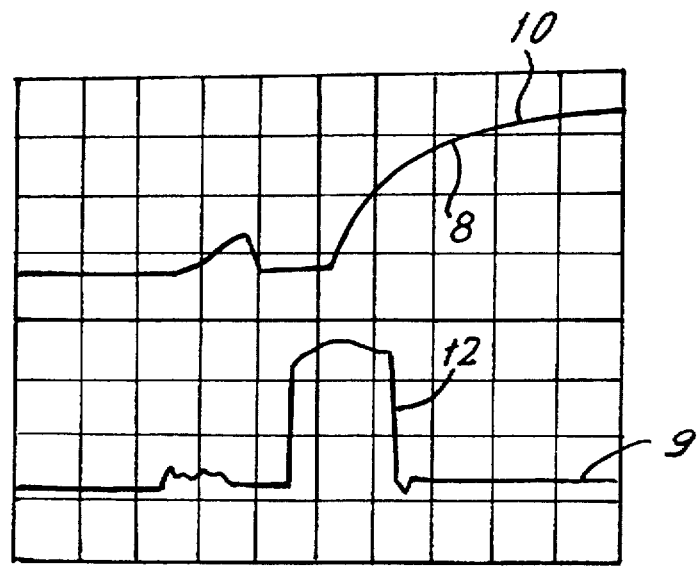
FIG. 2 is timing diagrams showing the glitch in the output of the opto-isolator during power-up, and the associated momentary turn ON of the IGBT in the circuit of FIG. 1.
Figure 3:
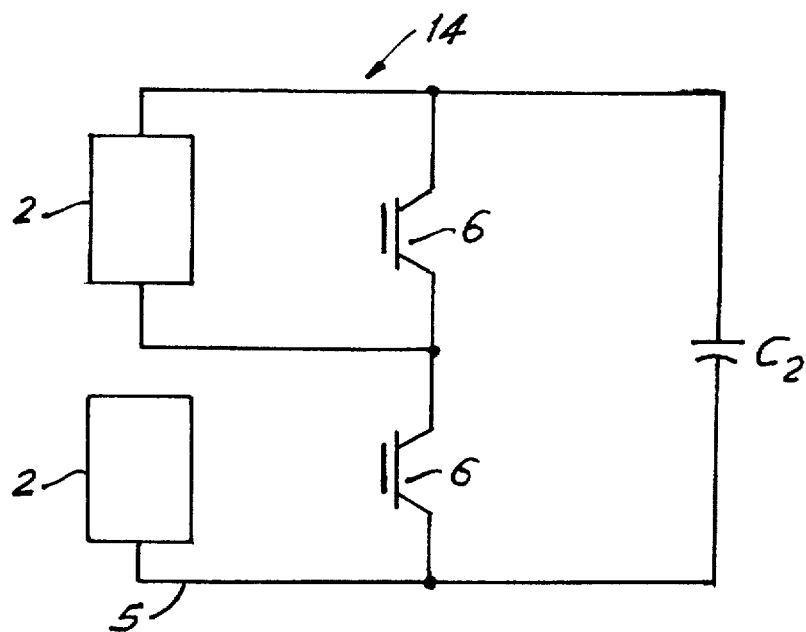
FIG. 3 is a schematic diagram of a prior art power circuit incorporating two IGBTs.
Figure 4:
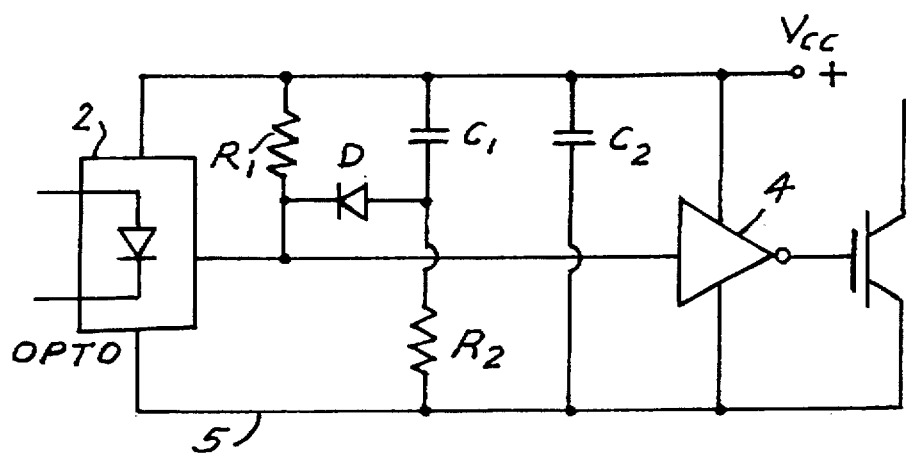
FIG. 4 is a schematic diagram of the circuit of the present invention.

The circuit of the present invention includes, as shown in FIG. 4, a diode D, capacitor $C_1$, and a resistor $R_2$ which clamp the output of the opto-isolator 2 to a higher voltage than the voltage required to drive the buffer 4. The value of capacitor $C_1$ is selected to swamp the internal transistor of the opto-isolator 2. Capacitor $C_1$ charges up to the supply voltage $V_{cc}$ and thereafter does not affect system timing delays during normal operation, as it is fully charged and isolated from opto-isolator driver 2 in the normal case.

If the power supply dies down, capacitor $C_1$ discharges and resets itself. When the power supply restarts, capacitor $C_1$ is ready to clamp the next glitch from the opto-isolator 2 as before.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A driver for a power switching transistor, comprising:
   a buffer circuit having an output for driving a gate electrode of the switching transistor;
   an opto-isolated driver having an opto-isolator output for driving an input electrode of the buffer circuit;
   a DC supply for providing power to the opto-isolated driver and to the buffer circuit;
   a common line; and
   a protection circuit coupled to the output of the opto-isolator, the protection circuit being effective for assuring that the opto-isolated driver does not turn the switching transistor on, via the buffer circuit, when the voltage between the DC supply and the common line ramps up from about 0 volts to a predetermined supply voltage.

2. The driver of claim 1, in which the protection circuit comprises an R-C network connected between the DC supply and the common line.

3. The driver of claim 2, in which the protection circuit comprises a capacitor having a first node connected to the DC supply and a second node, a resistor connected in series with the capacitor, and including a diode connected from the second node of the capacitor to the opto-isolator output.

4. The driver of claim 2, in which the protection circuit is self-resetting.

5. The driver of claim 3, in which the capacitor discharges and resets itself whenever power to the DC supply is temporarily removed.

6. The driver of claim 2, in which the protection circuit is effective to clamp the output of the opto-isolator to a higher voltage than the voltage required to drive the buffer circuit.

7. The driver of claim 3, in which the capacitor of the protection circuit is selected to swamp an internal transistor of the opto-isolator.

8. The driver of claim 3, including a filtering capacitor connected in parallel across the buffer circuit.

9. The driver of claim 3, including a further resistor connected between the DC supply and the opto-isolator output.

* * * * *